(12) United States Patent
Wu et al.

(10) Patent No.: US 11,688,635 B2
(45) Date of Patent: Jun. 27, 2023

(54) OXYGEN-FREE REPLACEMENT LINER FOR IMPROVED TRANSISTOR PERFORMANCE

(71) Applicant: International Business Machines Corporation, Armonk, NY (US)

(72) Inventors: Heng Wu, Guilderland, NY (US); Dechao Guo, Niskayuna, NY (US); Junli Wang, Slingerlands, NY (US); Ruqiang Bao, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 17/131,998

(22) Filed: Dec. 23, 2020

(65) Prior Publication Data

US 2021/0111068 A1 Apr. 15, 2021

Related U.S. Application Data

(62) Division of application No. 16/252,763, filed on Jan. 21, 2019, now Pat. No. 10,971,399.

(51) Int. Cl.
*H01L 23/532* (2006.01)
*H01L 21/768* (2006.01)
(Continued)

(52) U.S. Cl.
CPC .. *H01L 21/76889* (2013.01); *H01L 21/76805* (2013.01); *H01L 21/76843* (2013.01); *H01L 21/76895* (2013.01); *H01L 21/823821* (2013.01); *H01L 21/823871* (2013.01); *H01L 23/535* (2013.01); *H01L 23/53266* (2013.01);
(Continued)

(58) Field of Classification Search
CPC .......... H01L 21/76802–76817; H01L 21/76877–76883; H01L 21/823475; H01L 21/76897; H01L 21/76895; H01L 21/76889; H01L 21/823821; H01L 21/823871; H01L 23/53266; H01L 23/535; H01L 27/0924; H01L 29/6653
See application file for complete search history.

(56) References Cited

U.S. PATENT DOCUMENTS 5,817,562 A 10/1998 Chang et al.
6,025,255 A 2/2000 Chen et al.
(Continued)

OTHER PUBLICATIONS

List of IBM Patents or Patent Applications Treated as Related; Date Filed: Jan. 11, 2021, 2 pages.

*Primary Examiner* — Tucker J Wright
(74) *Attorney, Agent, or Firm* — Cantor Colburn LLP; Daniel Yeates

(57) ABSTRACT

Embodiments of the invention are directed to an integrated circuit. A non-limiting example of the integrated circuit includes a transistor formed over a substrate. A dielectric region is formed over the transistor and the substrate. A trench is positioned in the dielectric region and over a S/D region of the transistor. A first liner and a conductive plug are within the trench such that the first liner and the conductive plug are only present within a bottom portion of the trench. A substantially oxygen-free replacement liner and a S/D contact are within the top portion of the trench such that a bottom contact surface of the S/D contact directly couples to a top surface of the conductive plug.

20 Claims, 14 Drawing Sheets

(51) Int. Cl.
  *H01L 27/092* (2006.01)
  *H01L 23/535* (2006.01)
  *H01L 21/8238* (2006.01)
  *H01L 29/66* (2006.01)

(52) U.S. Cl.
  CPC ...... *H01L 27/0924* (2013.01); *H01L 29/6653* (2013.01)

(56) References Cited

U.S. PATENT DOCUMENTS

| | | |
|---|---|---|
| 9,455,254 B2 | 9/2016 | Xie et al. |
| 9,472,447 B1 | 10/2016 | Kanakasabapathy et al. |
| 9,496,362 B1 | 11/2016 | Alptekin et al. |
| 9,634,110 B2 | 4/2017 | Greene et al. |
| 9,780,178 B2 | 10/2017 | Xie et al. |
| 9,929,246 B1 | 3/2018 | Cheng et al. |
| 2004/0058481 A1 | 3/2004 | Xu et al. |
| 2005/0227466 A1 | 10/2005 | Kruger et al. |
| 2008/0001202 A1 | 1/2008 | Schaeffer et al. |
| 2011/0298061 A1 | 12/2011 | Siddiqui et al. |
| 2013/0049219 A1* | 2/2013 | Tsai ................ H01L 21/02063 257/774 |
| 2014/0011329 A1 | 1/2014 | Zhang et al. |
| 2015/0249036 A1 | 9/2015 | Cai et al. |
| 2017/0263715 A1 | 9/2017 | Bouche et al. |
| 2020/0235008 A1 | 7/2020 | Wu et al. |

* cited by examiner

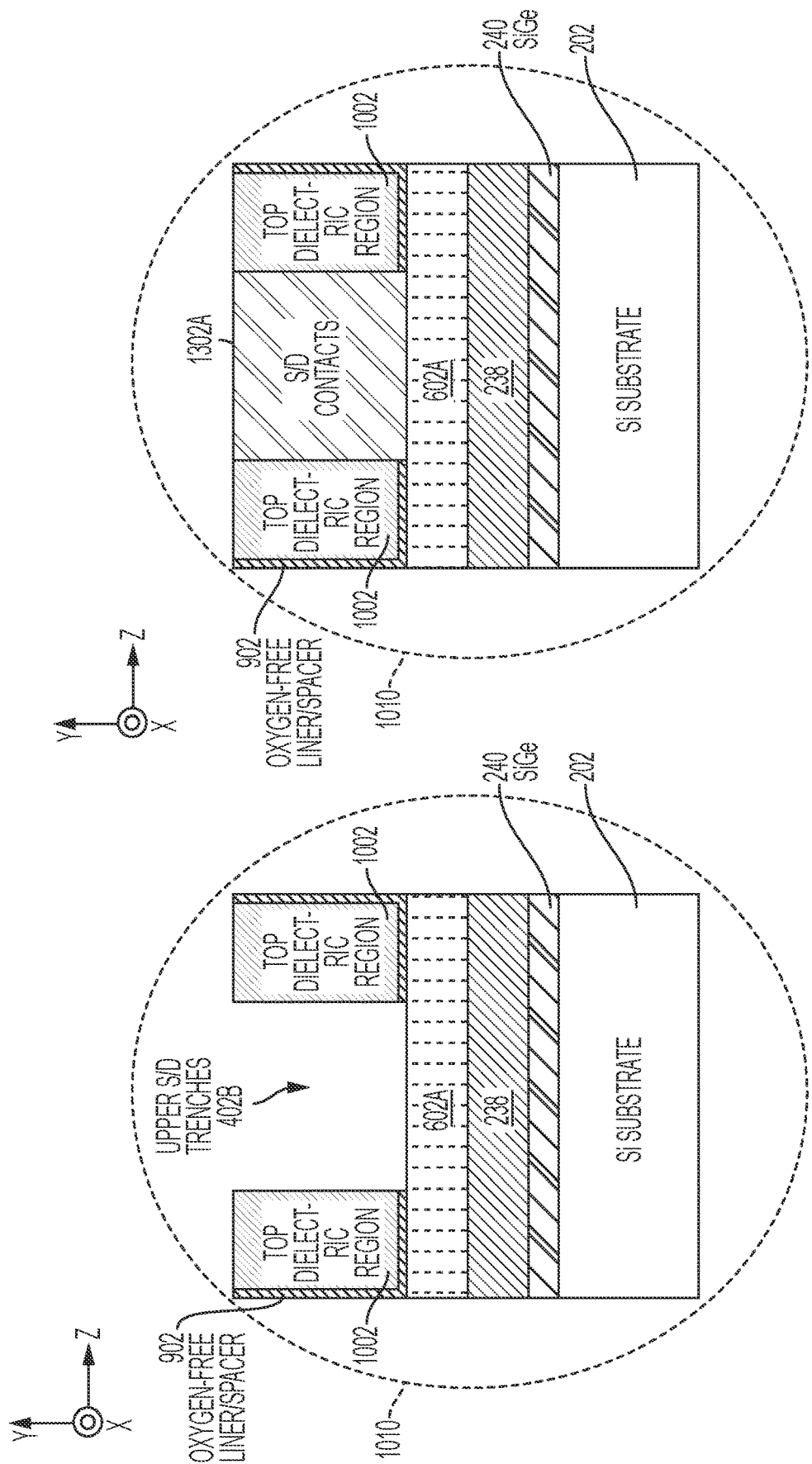

OXYGEN-FREE REPLACEMENT LINER FOR IMPROVED TRANSISTOR PERFORMANCE

This application is a divisional of U.S. patent application Ser. No. 16/252,763, filed Jan. 21, 2019, the disclosure of which is incorporated by reference herein in its

BACKGROUND

The present invention relates in general to fabrication methodologies and resulting structures for semiconductor devices. More specifically, the present invention is related to a substantially oxygen-free replacement liner applied during fabrication of a transistor for improving multiple transistor performance characteristics.

Integrated circuits (ICs) are fabricated in a series of stages, including a front-end-of-line (FEOL) stage, a middle-of-line (MOL) stage and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections are formed above these logical and functional layers during the BEOL stage to complete the IC.

SUMMARY

Embodiments of the invention are directed to a method of forming an interconnect structure. A non-limiting example of the method includes forming a transistor over a substrate, forming a dielectric region over the transistor and the substrate, and forming a trench positioned in the dielectric region and over a source or drain (S/D) region of the transistor, wherein a sidewall of the trench includes a gate spacer of the transistor. A volume of the trench is increased by removing the gate spacer from the sidewall of the trench. A first liner and a conductive plug are deposited within a bottom portion of the trench.

Embodiments of the invention are directed to a method of forming an interconnect structure. A non-limiting example of the method includes forming a plurality of transistors over a substrate, wherein the plurality of transistors includes a plurality of gates. A dielectric region is formed over the plurality of transistors and the substrate. A trench is formed and positioned in the dielectric region and over a S/D region of one of the plurality of transistors, wherein a first sidewall of the trench includes a first gate spacer of a first one the plurality of gates, and wherein a second sidewall of the trench includes a second gate spacer of a second one of the plurality of gates. The first gate spacer and the second gate spacer each include oxygen. A volume of the trench is increased by removing the first gate spacer and the second gate spacer from the first and second sidewalls of the trench. A first liner and a conductive plug are deposited within a bottom portion of the trench such that the conductive plug is electrically coupled to the S/D region of the one of the plurality of transistors through a contact surface of the conductive plug.

Embodiments of the invention are directed to an integrated circuit. A non-limiting example of the integrated circuit includes a transistor formed over a substrate. A dielectric region is formed over the transistor and the substrate. A trench is positioned in the dielectric region and over a S/D region of the transistor. A first liner and a conductive plug are within a bottom portion of the trench. A substantially oxygen-free replacement liner and a S/D contact are within the top portion of the trench such that a bottom contact surface of the S/D contact directly couples to a top surface of the conductive plug.

Additional features and advantages are realized through the techniques described herein. Other embodiments and aspects are described in detail herein. For a better understanding, refer to the description and to the drawings.

BRIEF DESCRIPTION OF THE DRAWINGS

The subject matter which is regarded as the present invention is particularly pointed out and distinctly claimed in the claims at the conclusion of the specification. The foregoing and other features and advantages are apparent from the following detailed description taken in conjunction with the accompanying drawings in which:

FIGS. 2-13 depict the results of fabrication operations for forming a FinFET device having a substantially oxygen-free replacement liner applied during fabrication thereof to improve multiple transistor performance characteristics, in which:

FIG. 2 depicts a cross-sectional view of a representative section of an IC after fabrication operations according to embodiments of the invention;

FIG. 3 depicts a cross-sectional view of the representative section of the IC after fabrication operations according to embodiments of the invention;

FIG. 4 depicts a cross-sectional view of the representative section of the IC after fabrication operations according to embodiments of the invention;

FIG. 5 depicts a cross-sectional view of the representative section of the IC after fabrication operations according to embodiments of the invention;

FIG. 6 depicts a cross-sectional view of the representative section of the IC after fabrication operations according to embodiments of the invention;

FIG. 7 depicts a cross-sectional view of the representative section of the IC after fabrication operations according to embodiments of the invention;

FIG. 8 depicts a cross-sectional view of the representative section of the IC after fabrication operations according to embodiments of the invention;

FIG. 9 depicts a cross-sectional view of the representative section of the IC after fabrication operations according to embodiments of the invention;

FIG. 10 depicts a cross-sectional view of the representative section of the IC after fabrication operations according to embodiments of the invention;

FIG. 11 depicts a cross-sectional view of the representative section of the IC after fabrication operations according to embodiments of the invention;

FIG. 12 depicts a cross-sectional view of the representative section of the IC after fabrication operations according to embodiments of the invention; and FIG. 13 depicts a cross-sectional view of the representative section of the IC after fabrication operations according to embodiments of the invention;

FIGS. 14-15 depict the results of fabrication operations for forming a FinFET device having a substantially oxygen-free replacement liner applied during fabrication thereof to improve multiple transistor performance characteristics, in which:

FIG. 14 depicts a cross-sectional view of a representative section of an IC after fabrication operations according to embodiments of the invention; and FIG. 15 depicts a cross-sectional view of the representative section of the IC after fabrication operations according to embodiments of the invention.

Figure 1:
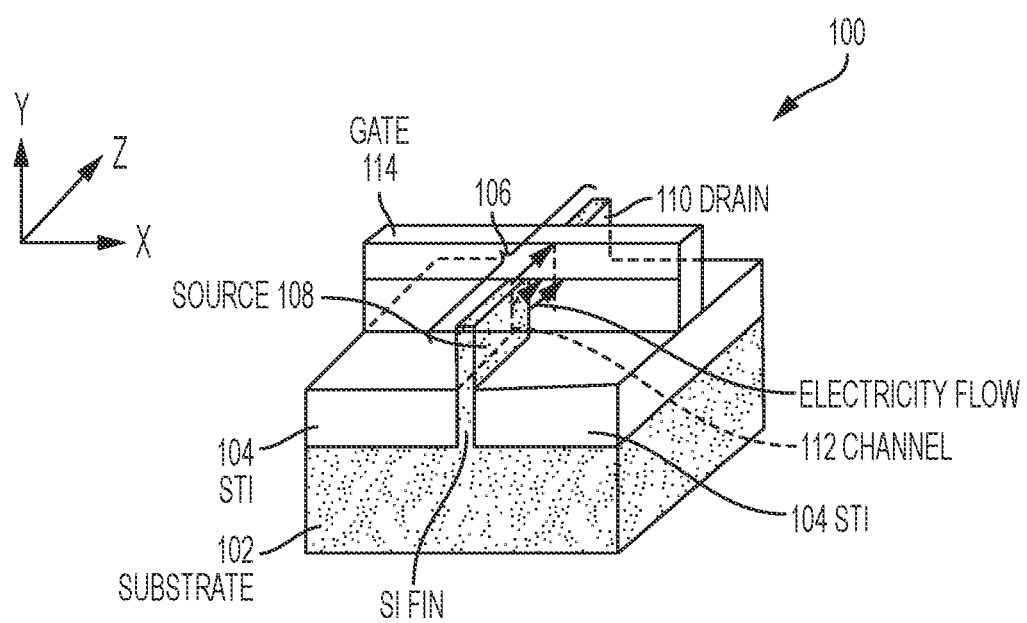
FIG. 1 depicts a three-dimensional view of an example configuration of a FinFET device capable of implementing embodiments of the invention.

In the accompanying figures and following detailed description of the embodiments, the various elements illustrated in the figures are provided with three or four digit reference numbers. The leftmost digit(s) of each reference number corresponds to the figure in which its element is first illustrated.

DETAILED DESCRIPTION

It is understood in advance that, although this description includes a detailed description of the formation and resulting structures for a specific type of interconnect stack in a particular type of IC device architecture (i.e., a FinFET), implementation of the teachings recited herein are not limited to a particular type of interconnect stack or IC architecture. Rather, embodiments of the present invention are capable of being implemented in conjunction with any other type of interconnect stack or IC architecture, now known or later developed. For example, embodiments of the invention are capable of being implemented with a nanosheet-based transistor.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to a description of technologies that are more specifically relevant to the present invention, semiconductor devices are used in a variety of electronic and electro-optical applications. ICs are typically formed from various circuit configurations of semiconductor devices (e.g., transistors, capacitors, resistors, etc.) and conductive interconnect layers (known as metallization layers) formed on semiconductor wafers. Alternatively, semiconductor devices can be formed as monolithic devices, e.g., discrete devices. Semiconductor devices and conductive interconnect layers are formed on semiconductor wafers by depositing many types of thin films of material over the semiconductor wafers, patterning the thin films, doping selective regions of the semiconductor wafers, etc.

In contemporary semiconductor fabrication processes, a large number of semiconductor devices and conductive interconnect layers are fabricated. More specifically, during the first portion of chip-making (i.e., the FEOL stage), the individual components (transistors, capacitors, etc.) are fabricated on the wafer. The MOL stage follows the FEOL stage and typically includes process flows for forming the contacts and other structures that communicatively couple to active regions (e.g., gate, source, and drain) of the device element. For example, the silicidation of source/drain regions, as well as the deposition of metal contacts, can occur during the MOL stage to connect the individual components fabricated during the FEOL stage. In the BEOL stage, these components are connected to each other to distribute signals, as well as power and ground. The conductive interconnect layers serve as a network of pathways that transport signals throughout an IC, thereby connecting circuit components of the IC into a functioning whole and to the outside world. Because there typically isn't enough room on the chip surface to create all of the necessary connections in a single layer, chip manufacturers build vertical levels of interconnects. While simpler ICs can have just a few metal layers, complex ICs can have ten or more layers of wiring.

Interconnect structures close to the transistors need to be small because they attach/join to the components that are themselves very small and often closely packed together. These lower-level lines, which can be referred to as local interconnects, are usually thin and short in length. Global interconnects are higher up in the structure and travel between different blocks of the circuit. Thus, global interconnects are typically thick, long, and widely separated. Connections between interconnect levels, called vias, allow signals and power to be transmitted from one layer to the next.

Interconnect structures are often formed in a stack. For example, a transistor can have a gate contact (also referred to as a CB contact) and S/D contacts (also referred to as CA contacts). The S/D contacts can extend through an interlayer dielectric (ILD) region of the IC from a metal wire or via in the BEOL metal level to metal plugs (also referred to as trench silicide (TS) contacts), which are on the S/D regions of the transistor. A conventional interconnect stack fabrication process starts with the deposition of an ILD insulating material (e.g., $SiO_2$) over the transistor followed by the creation of trenches in the ILD insulating material. The trenches are positioned over the portion of the transistor (source, gate, drain) to which electrical coupling will be made. The liner/barrier material is deposited within the trench, and, for S/D regions, the remaining trench volume is filled with material that will form the metal plugs (or TS contacts) using, for example, a chemical/electroplating process. The excess metal is removed to form a flat surface for subsequent processing. A cap layer can be deposited over the exposed top surface of the metal plug. This process is repeated until all portions of the interconnect structure stack have been formed.

For the S/D interconnect structures of non-planar FETs (e.g., a FinFET), the trench formed in the ILD region is over the S/D regions and adjacent the gate sidewall spacers of the metal gate. Thus, the gate sidewall spacers protect the metal gate from the etch process (e.g., a reactive ion etch (RIE)) that is applied in order to form the trench. The gate sidewall spacers also support some of the functionality of the trench liner that is deposited in the trench prior to forming the metal plus. However, at the S/D fabrication stage of the overall transistor fabrication process, the gate sidewall spacers have been exposed to high thermal budget processes (e.g., the replacement metal gate (RMG) process) and a persistent oxygen ambient, which can weaken and erode the gate sidewall spacers. More specifically, the erosion of and weakening of the gate sidewall spacers results from the penetration of oxygen into the gate sidewall spacers during the upstream high thermal budget processes, high oxygen ambient processes. Accordingly, at the S/D interconnect fabrication stage of a non-planar FET, the gate sidewall spacers have been contaminated with oxygen by various high thermal budget and high oxygen ambient upstream processes, and the oxygen contamination has weakened/eroded the gate sidewall spacers. Because the gate sidewall's physical integrity impacts the maximum gate bias voltage (Vmax) that can be applied to the FET, a weakening of the gate sidewalls also limits Vmax, which limits the ability to implement high performance applications. Also, the weakening of the gate sidewalls increases the potential for gate-to-CA shorts.

With continued reductions in device dimensions, a limiting factor for the operating speed of the final IC product is no longer the individual transistor element but the electrical performance of the complex interconnect/wiring system that is formed above the device level of the IC. More specifically, as IC feature sizes continue to decrease, the aspect ratio, (i.e., the ratio of height/depth to width) of features such as interconnect structures generally increases, which can decrease the contact area for metal plugs that interface with the S/D regions. In general, a reduction in contact area increases contact resistance. With the continued reductions in device dimensions, the potential for gate-to-CA shorts is further increased due to smaller spaces between the gate and the gate contact (CA).

Turning now to an overview of aspects of the invention, embodiments of the invention address the problem of weakened and eroded gate sidewall spacers by removing the weakened and eroded gate sidewall spacers at selected stages of the S/D interconnect fabrication process, and replacing the removed gate sidewall spacers with a substantially oxygen-free replacement spacer/liner. More specifically, in embodiments of the invention, after formation of the S/D contact trench adjacent to the damaged and oxygen-contaminated gate spacers and over the S/D region, the damaged gate spacers are removed from the S/D contact trench, and a liner and a metal plug (or TS contact) are formed in a bottom region of the S/D contact trench. Because the damaged gate spacer has been removed, the volume of the metal plug in the bottom region of the S/D contact trench is increased, which increase the metal plug's contact area and decreases the metal plug's contact resistance. Additionally, the removal of the damaged gate spacer from the bottom region of the S/D trench reduces the potential for parasitic capacitance between the gate and the metal plug (or TS contact), which improves the transistor's alternating current (AC) performance.

In embodiments of the invention, the substantially oxygen-free replacement spacer/liner is deposited on sidewalls of the upper region of the S/D contact trench, and a S/D contact (CA) is deposited in the remaining space of the upper region of the S/D contact trench. Because the replacement spacer/liner is applied after the high thermal budget and high oxygen ambient fabrication processes (e.g., RMG), the replacement spacer/liner is substantially oxygen-free and thus has high physical integrity. The oxygen-free, high physical integrity replacement spacer/liner improves multiple transistor performance characteristics, including the gate's ability to tolerate a higher maximum gate bias voltage (Vmax), as well as reducing the potential for gate-to-CA shorts. In embodiments of the invention, the potential for gate-to-CA shorts can be further reduced by decreasing a width dimension of the S/D contact (CA) and filling the space between the replacement liner and the reduced-width S/D contact with additional dielectric fill material.

In embodiments of the invention, although the contact area between the metal plug (TS contact) and the S/D region is greater than the contact area between the metal plug and the S/D contact (CA), the primary impact on the resistance for current following vertically from the S/D region through the metal plug and the S/D contact is the contact area between the metal plug and the S/D region. Hence, improving the contact area between the metal plug and the S/D region reduces the contact resistant for the entire metal plug and S/D contact structure despite the reduced contact area between the metal plug and the S/D contact.

Turning now to a more detailed description of aspects of the present invention, FIG. 1 depicts a three-dimensional view of an example configuration of a FinFET device 100 capable of implementing embodiments of the invention. The basic electrical layout and mode of operation of FinFET 100 do not differ significantly from a traditional FET. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., silicon oxide), and fin 106 can be silicon that has been enriched to a desired concentration level of germanium. Gate 114 controls the source to drain current flow (labeled ELECTRICITY FLOW in FIG. 1).

In contrast to planar MOSFETs, the source 108, drain 110 and channel 112 regions are built as a three-dimensional bar on top of the STI layer 104 and the semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

In some FinFET architectures, raised source/drain (S/D) regions (not shown in FIG. 1) can be epitaxially grown over the S/D portions 108, 110 of the fin 106 to increase the S/D volume and provide a larger surface for interfacing S/D conductive contacts (not shown in FIG. 1) with the raised S/D region. The S/D contacts are formed on either side of the gate structure 114, which includes a conductive gate material (e.g., tungsten (W), aluminum (Al), and the like) bound at its lower portion by a dielectric liner (not shown).

FIGS. 2-13 depict a semiconductor structure 200 (e.g., a wafer) after fabrication operations for forming FinFET devices thereon in accordance with aspects of the invention. Each FinFET device formed on the structure 200 includes a substantially oxygen-free replacement spacer/liner 902 (shown in FIG. 12) applied to an upper S/D contact trench region 402A (shown in FIG. 12), wherein the substantially oxygen-free replacement spacer/liner 902 improves multiple transistor performance characteristics.

Figure 2:
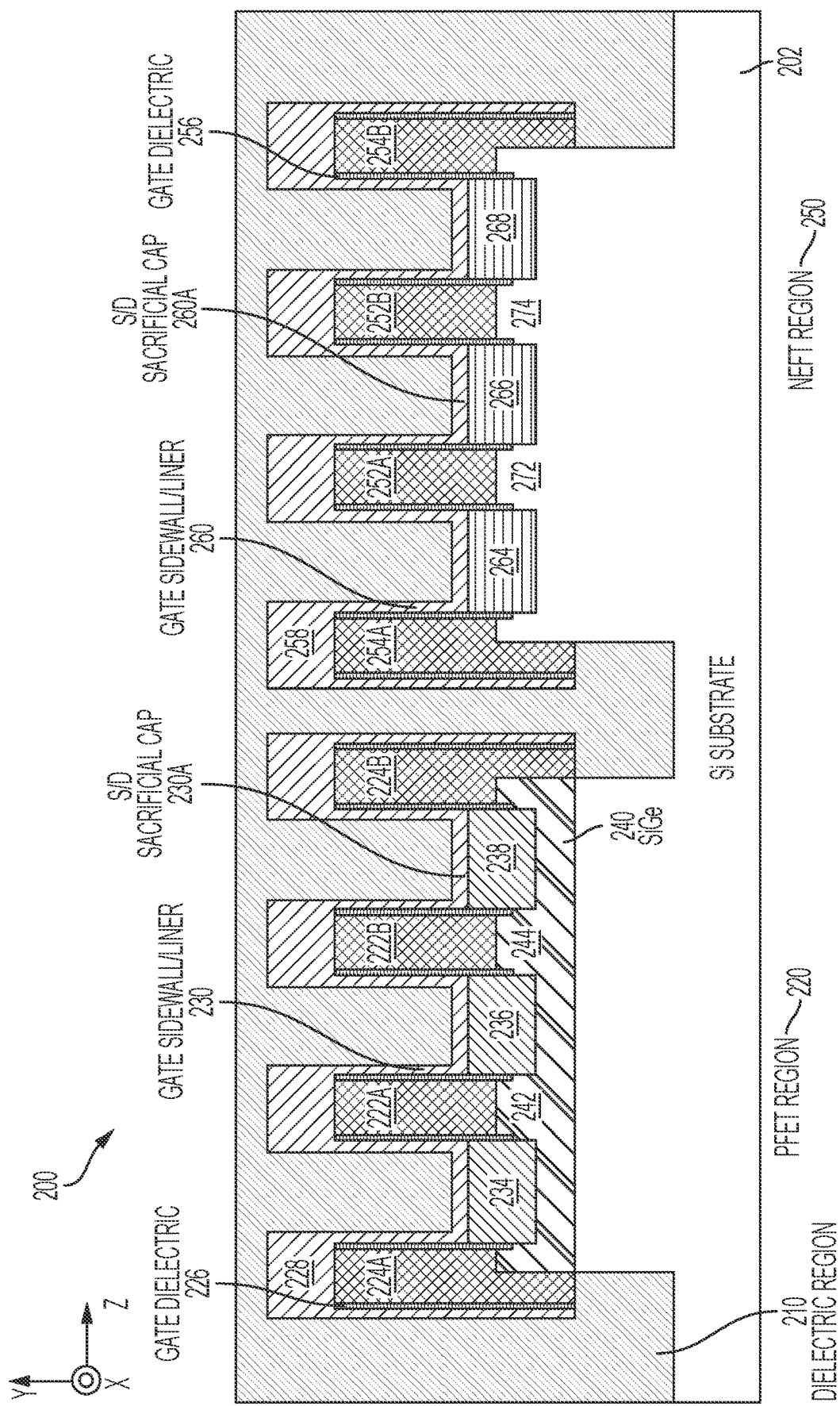

FIG. 2 depicts the semiconductor structure 200 after initial fabrication stages according to embodiments of the invention. Known fabrication operations have been used to form the semiconductor structure 200 shown in FIG. 2. A variety of fabrication operations are suitable for fabricating the semiconductor structure 200 to the stage shown in FIG. 2. Because the fabrication operations are well-known, they have been omitted in the interest of brevity. In embodiments of the invention, the structure 200 will be, after completion of the fabrication process, two in-series n-type MOSFETs formed in an NFET region 250 of a Si wafer/substrate 202, along with two in-series p-type MOSFETs formed in a PFET region 220 of the Si wafer/substrate 202. The number of p-type and n-type MOSFETs shown in the figures is for ease of illustration, and in practice any number of p-type and n-type MOSFETs can be provided. In the example depicted in FIG. 2, the n-type MOSFETs in the NFET region 250 and the p-type MOSFETs in the PFET region 220 are FinFET architectures having doped Si raised S/D regions 264, 266, 268, 234, 236, 238. However, as previously noted herein, embodiments of the invention are not limited to a particular type of MOSFET device or IC architecture. Rather, embodiments of the invention are capable of being implemented in conjunction with any type of planar or non-planar transistor device or IC architecture, now known or later developed, for which there is a need to form conductive contacts to a S/D of the transistor device.

In the NFET region 250 of the substrate 202, two n-type MOSFETs are shown coupled in series with a shared S/D region 266. The gates 254A, 254B are inactive, and the first in-series n-type MOSFET is defined by an active gate 252A, a channel 272, a S/D region 264, and the shared S/D region 266. The second in-series n-type MOSFET is defined by an active gate 252B, a channel 274, a S/D region 264, and the shared S/D region 266. The channel regions 272, 274 can be lightly doped or undoped Si. The active and inactive gates 254A, 254B, 252A, 252B include cap regions 258, gate dielectric layers 256 (e.g., SiBCN, SiOCN, SiCN), and gate sidewall spacers/liners 260, configured and arranged as shown. S/D cap regions 260A are formed over the S/D regions 264, 266, 268.

In the PFET region 220 of the substrate 202, two p-type MOSFETs are shown coupled in series with a shared S/D region 236. The gates 224A, 224B are inactive, and the first in-series p-type MOSFET is defined by an active gate 222A, a channel 242, a S/D region 234, and the shared S/D region 236. The second in-series p-type MOSFET is defined by an active gate 222B, a channel 244, a S/D region 238, and the shared S/D region 236. The channel regions 242, 244 are formed from SiGe or Si material 240 and can be lightly doped or undoped. The active and inactive gates 224A, 224B, 222A, 222B include cap regions 228, gate dielectric layers 226 (e.g., SiBCN, SiOCN, SiCN), and gate sidewall spacers/liners 230, configured and arranged as shown. S/D cap regions 230A are formed over the S/D regions 234, 236, 238. A dielectric region 210 is deposited over the PFET and NFET regions 220, 250 of the semiconductor structure 200.

In general, the gate dielectrics 226, 256, the gate caps 228, 258, and the S/D cap regions 230A, 260A can include any suitable dielectric material, including but not limited to silicon oxide, silicon nitride, silicon oxynitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric can further include dopants such as lanthanum, aluminum, magnesium.

The gates 224A, 224B, 222A, 222B, 254A, 254B, 252A, 252B can include any suitable conducting material. The conductive material can further include dopants that are incorporated during or after deposition. In some embodiments of the invention, the gates 224A, 224B, 222A, 222B, 254A, 254B, 252A, 252B can further include a workfunction setting layer between the gate dielectric 226, 256 and the gate 224A, 224B, 222A, 222B, 254A, 254B, 252A, 252B. The workfunction setting layer can be a workfunction metal formed from any suitable material. In some embodiments of the invention, a conductive material or a combination of multiple conductive materials can serve as both gate conductor and WFM.

Figure 3:
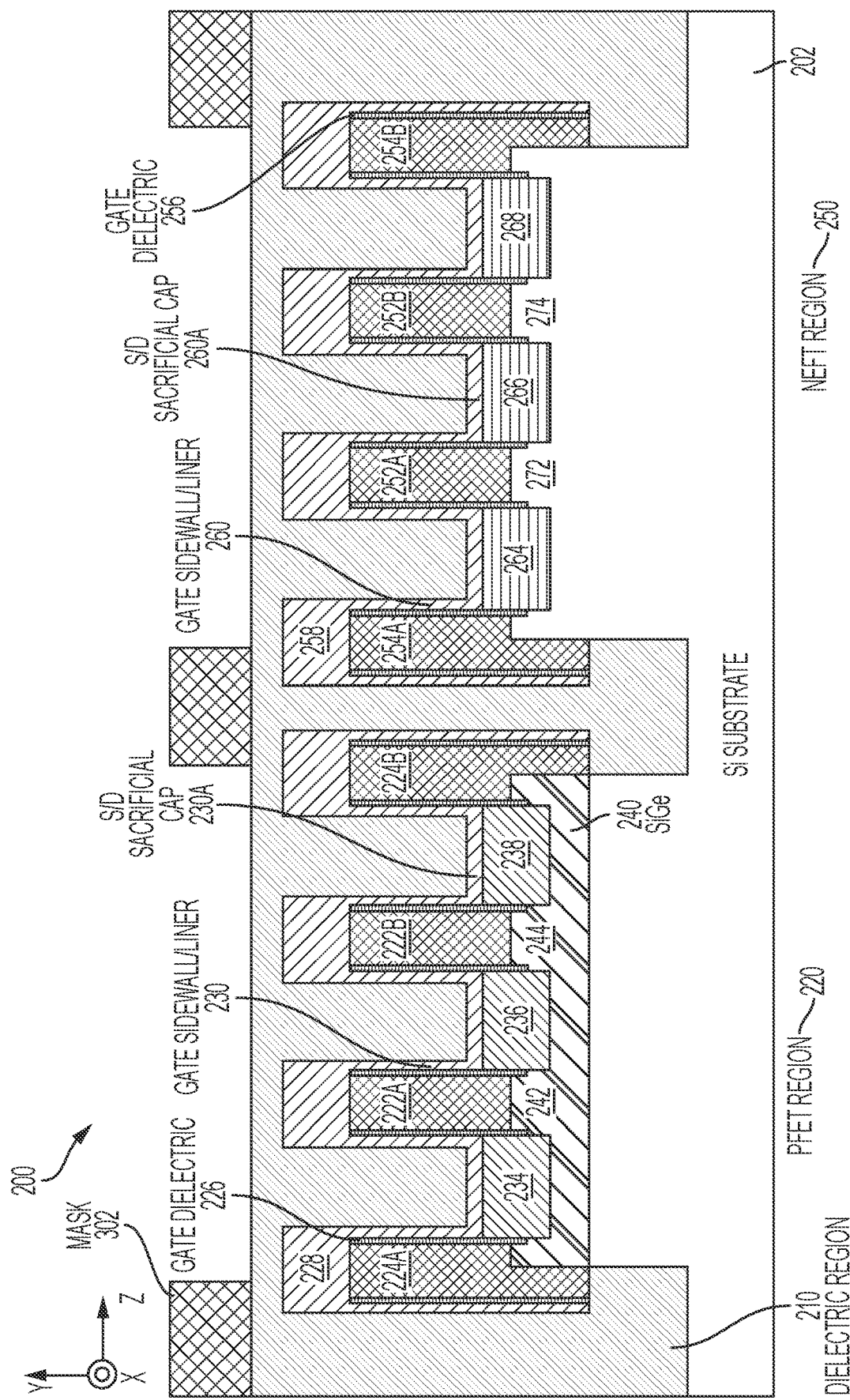

In FIG. 3, known semiconductor fabrication processes have been used to deposit a blocking mask 302 over selected portions of the inactive gates 224A, 224B, 254A, 254B. In embodiments of the invention, the blocking mask 302 can be any suitable masking material, including but not limited to, photoresist, photoresist in conjunction with an organic planarization layer (OPL), or any suitable hardmask material. In general, OPLs are used to fill pre-existing features, and to planarize the substrate to allow for larger patterning process windows.

Figure 4:
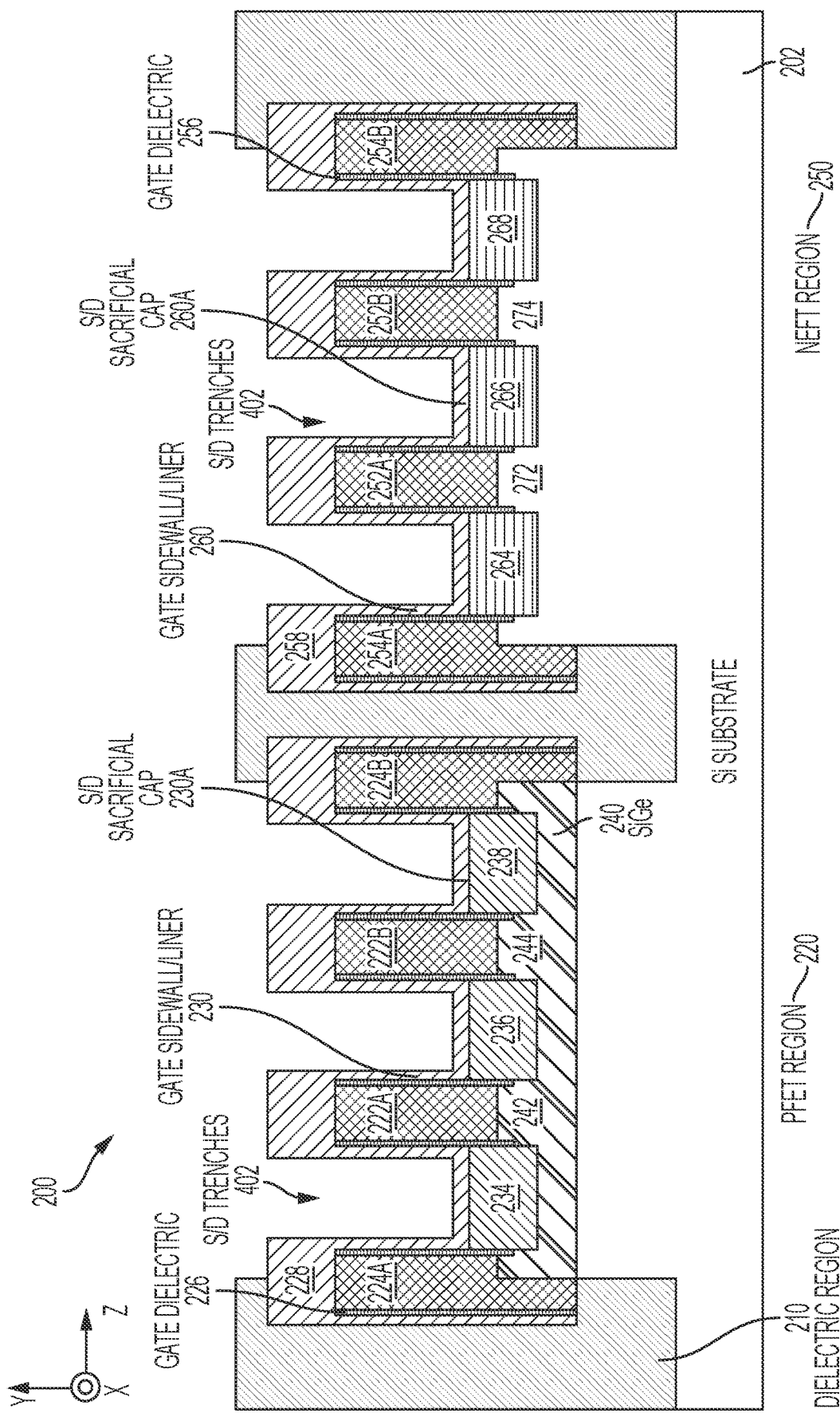

In FIG. 4, the blocking mask 302 (shown in FIG. 3) has been removed, and known semiconductor fabrication processes (e.g., a reactive ion etch (ME)) have been used to remove non-masked portions of the dielectric region 210, thereby opening the S/D contact trenches 402. In accordance with aspects of the invention, the S/D cap regions 230A, 260A function as an etch-stop layer that prevents the RIE that was used to remove the non-masked portions of the dielectric region 210 from also removing portions of the S/D regions 234, 236, 238, 264, 266, 268. After the fabrication stage depicted in FIG. 4, the gate sidewall spacers 230, 260 and the S/D cap regions 230, 260 have been exposed to high thermal budget processes (e.g., the RMG process used to form the gates 224A, 224B, 222A, 222B, 254A, 254B, 252A, 252B) and a persistent oxygen ambient, which have weakened and eroded the gate sidewall spacers 230, 260 and the S/D cap regions 230, 260. More specifically, the erosion and weakening of the gate sidewall spacers 230, 260 and the S/D cap regions 230, 260 result from the penetration of oxygen into the gate sidewall spacers 230, 260 during the upstream high thermal budget and high oxygen ambient processes. Accordingly, at the fabrication stage depicted in FIG. 4, the gate sidewall spacers 230, 260 and the S/D cap regions 230, 260 have been contaminated with oxygen by various high thermal budget and high oxygen ambient upstream processes.

Figure 5:
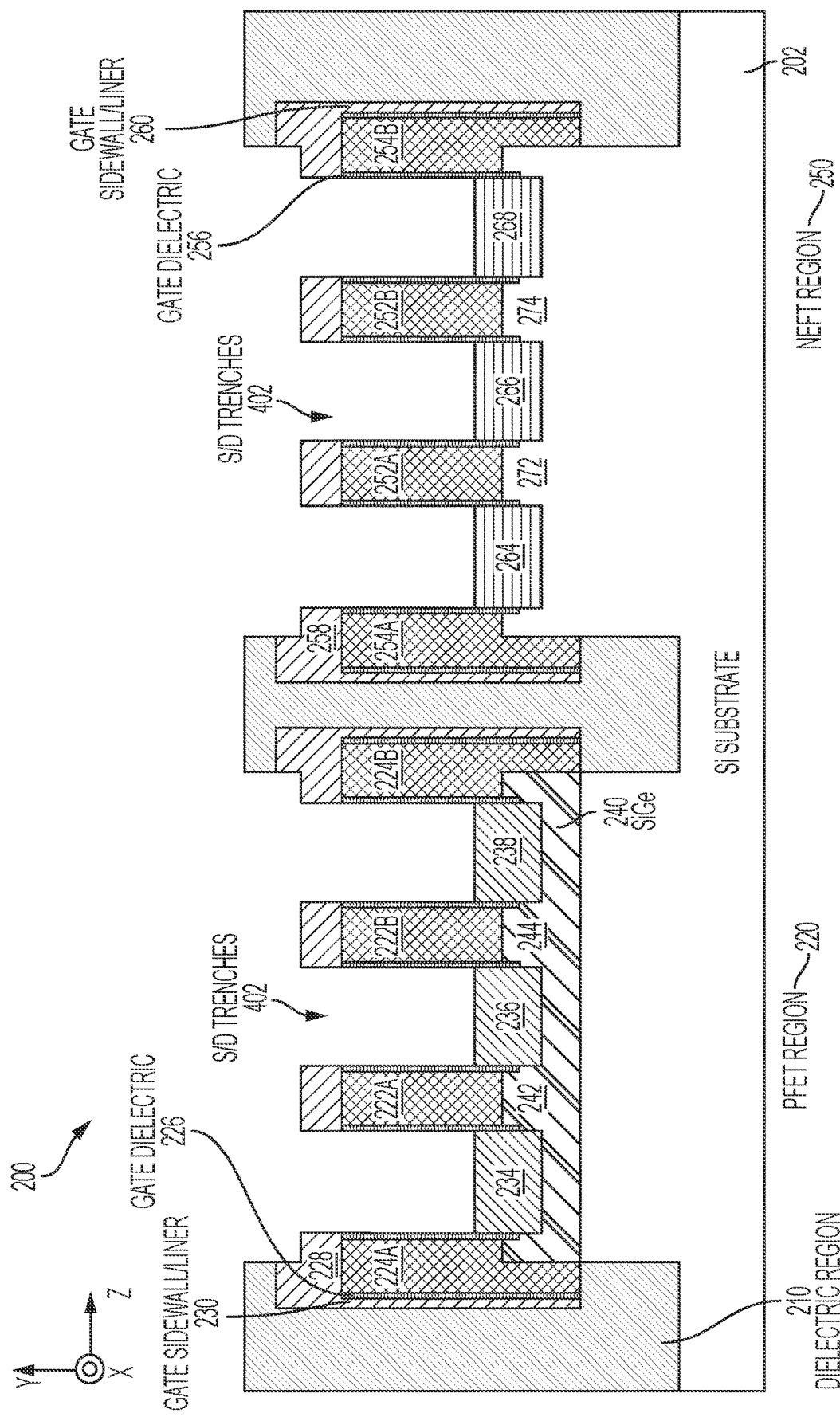

In FIG. 5, known semiconductor fabrication operations (e.g., a directional HF/HCl etch) have been used to remove the oxygen-contaminated, weakened and eroded gate sidewall spacers/liners 230, 260 and the oxygen-contaminated, weakened and eroded S/D cap regions 230, 260 from the S/D contact trench 402.

Figure 6:
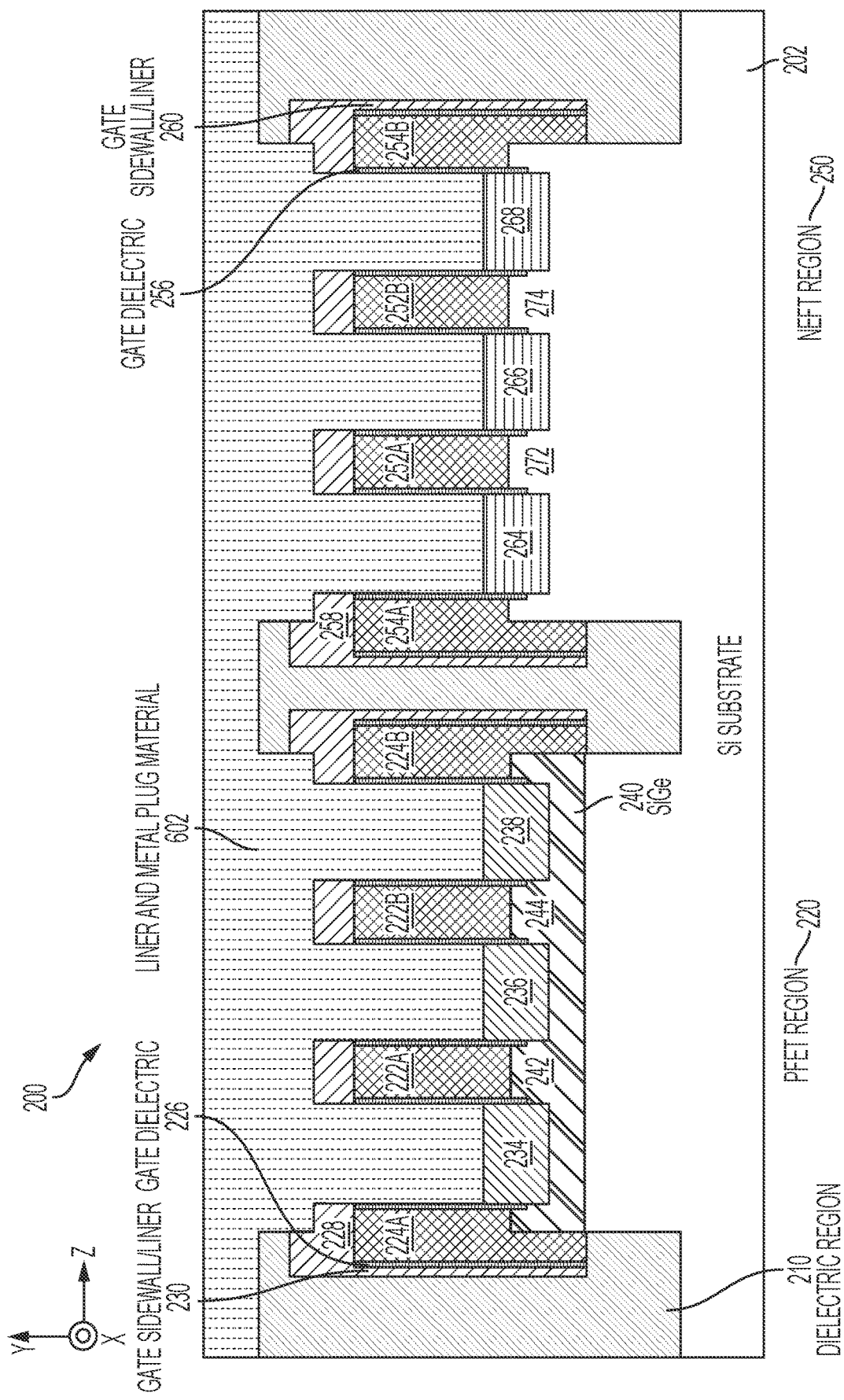

In FIG. 6, known semiconductor fabrication processes have been used to deposit a metal plug fill material and liner 602 in the S/D contact trench 402. The liner 602 can be deposited using any deposition technique suitable for the material that has been selected to form the liner. The liner 602 serves multiple functions, including, for example, function as a barrier to prevent metals in the metal plug material 602 from migrating out of the metal plug material 602. In embodiments of the invention, the liner 602 can be formed from a variety of materials, including, but not limited to TiN. The metal plug material 602 can be deposited using any suitable deposition process, including, for example, a chemical/electroplating process. In embodiments of the invention, the metal plug material 602 can be formed from a variety of low resistivity silicide materials, including, but not limited to, tungsten (W).

Figure 7:
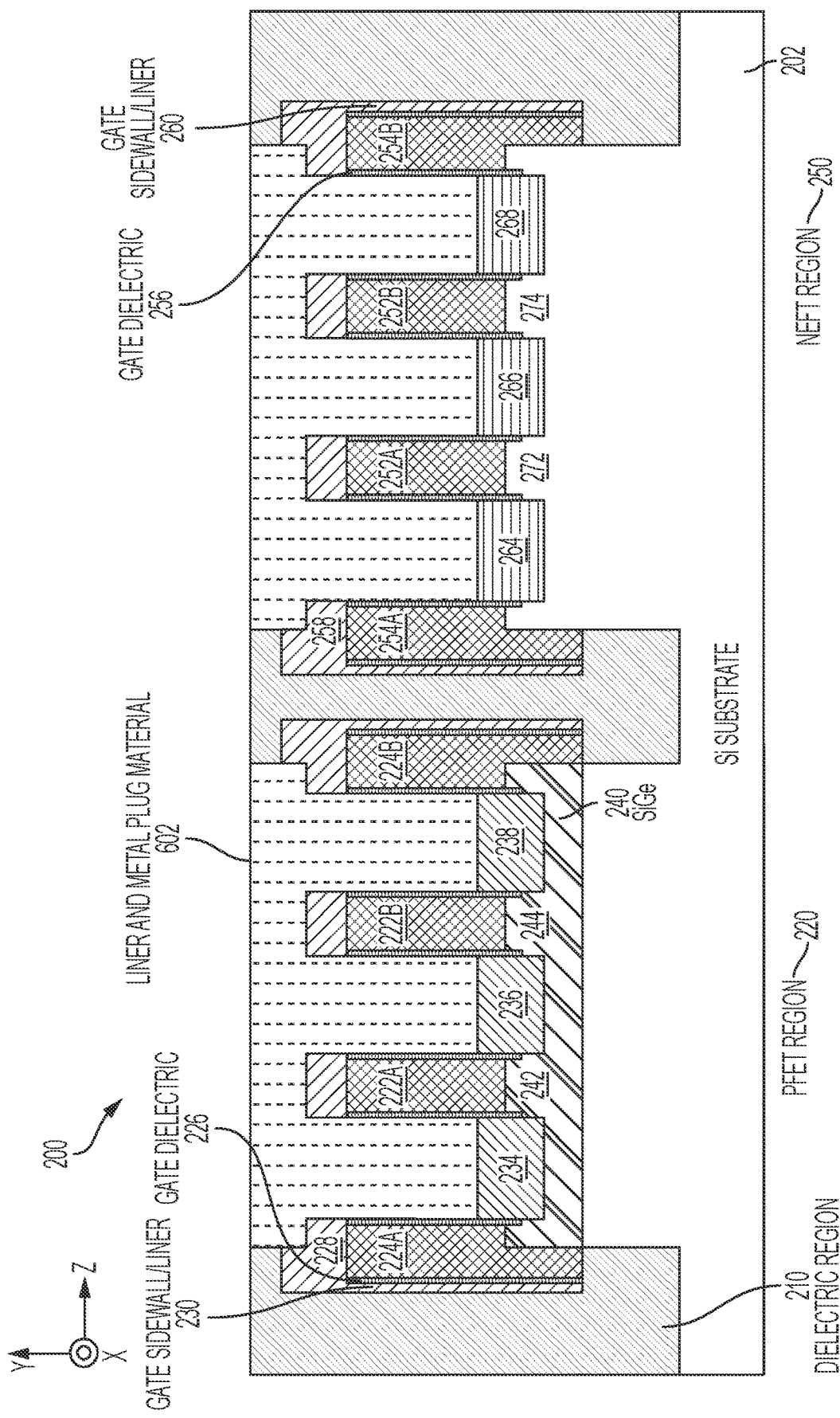

In FIG. 7, known semiconductor fabrication processes have been used to remove the excess metal plug material 602 and planarize it (e.g., using CMP) to form a flat surface for subsequent processing.

Figure 8:
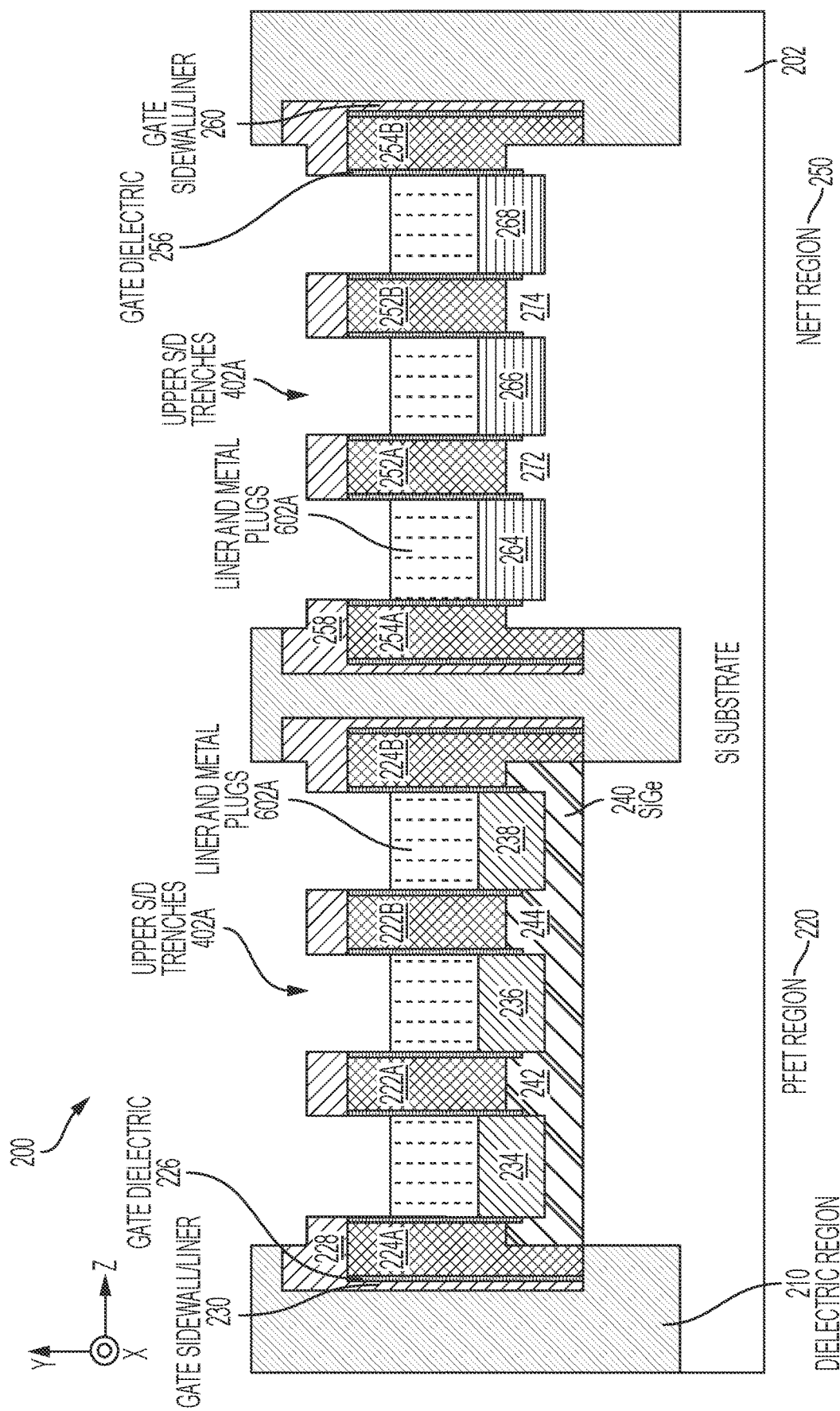

In FIG. 8, known semiconductor fabrication process have been used to partially recess the liner and metal plug material 602 (shown in FIG. 7) to form liners and metal plugs 602A in a bottom region of the S/D contact trench 402. In accordance with aspects of the invention, because the oxygen-contaminated sidewalls/liners 230, 260 has been removed, the volume of the liner and metal plug 602A in the bottom region of the S/D contact trench 402 is increased, which increase the contact area of the liner and metal 602A and decreases the contact resistance of the liners and metal plugs 602A. Additionally, the removal of the oxygen-contaminated sidewalls/liners 230, 260 from the bottom region of the S/D trench 402 reduces the potential for parasitic capacitance between the gates 224A, 224B, 222A, 222B, 254A, 254B, 252A, 252B and the liners and metal plugs 602A, which improves the final transistor's AC performance.

Figure 9:
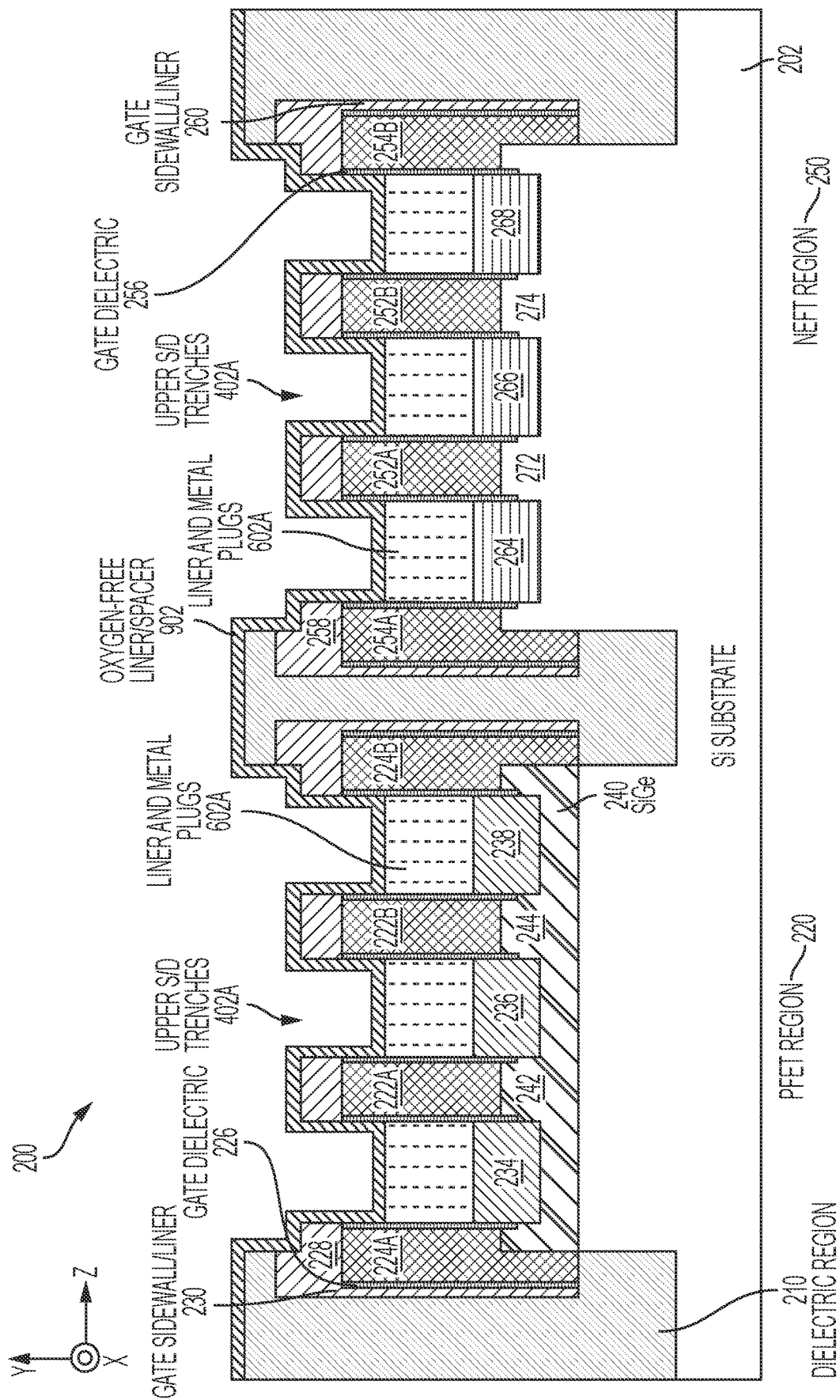

In FIG. 9, known semiconductor fabrication processes (e.g., ALD, CVD, and the like) have been used to conformally deposit a substantially oxygen-free replacement spacer/liner 902 over the structure 200 and specifically within upper regions of the S/D contact trenches 402, which are identified in FIG. 9 as upper S/D contact trenches 402A. Because the replacement spacer/liner 902 is applied after the high thermal budget and high oxygen ambient fabrication processes (e.g., RMG) that have been used to fabricate the structure 200, the replacement spacer/liner 902 is substantially oxygen-free and thus has high physical integrity.

Figure 10:
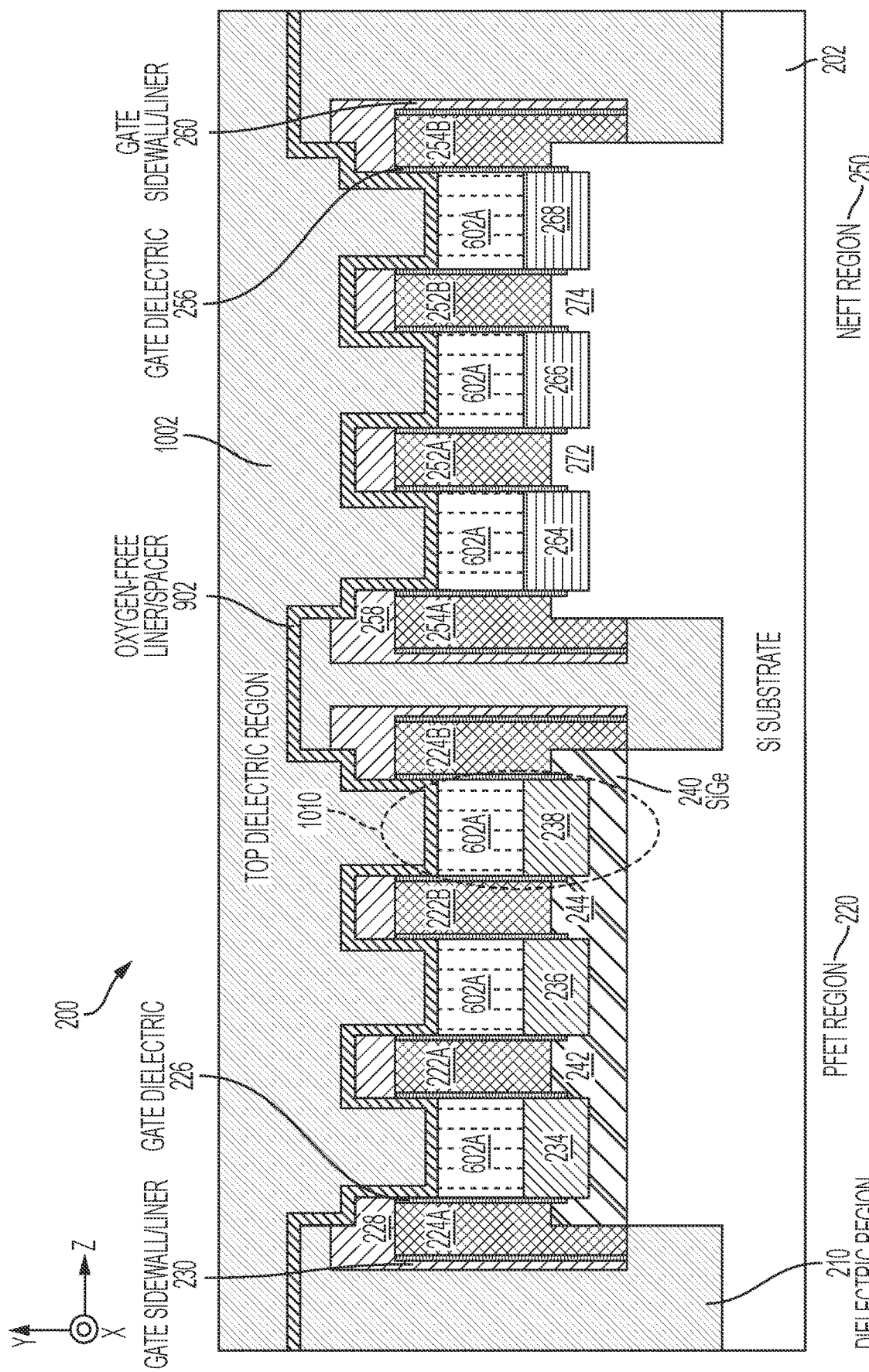

In FIG. 10, known semiconductor fabrication processes have been used to deposit and planarize a top dielectric region 1002 over the structure 200, thereby filling in the upper region S/D contact trenches 402A (shown in FIG. 9). In embodiments of the invention, the dielectric region 210 and the top dielectric region 1002 can be the same or different material. In some embodiments of the invention, the dielectric region 210 can be formed from a variety of dielectric materials, including, but not limited to, $SiO_2$. In some embodiments of the invention, the top dielectric region 1002 can be formed from a variety of low k dielectric materials, including, but not limited to, SiBCN, SiOCN, SiCN, and SiN.

Figure 11:
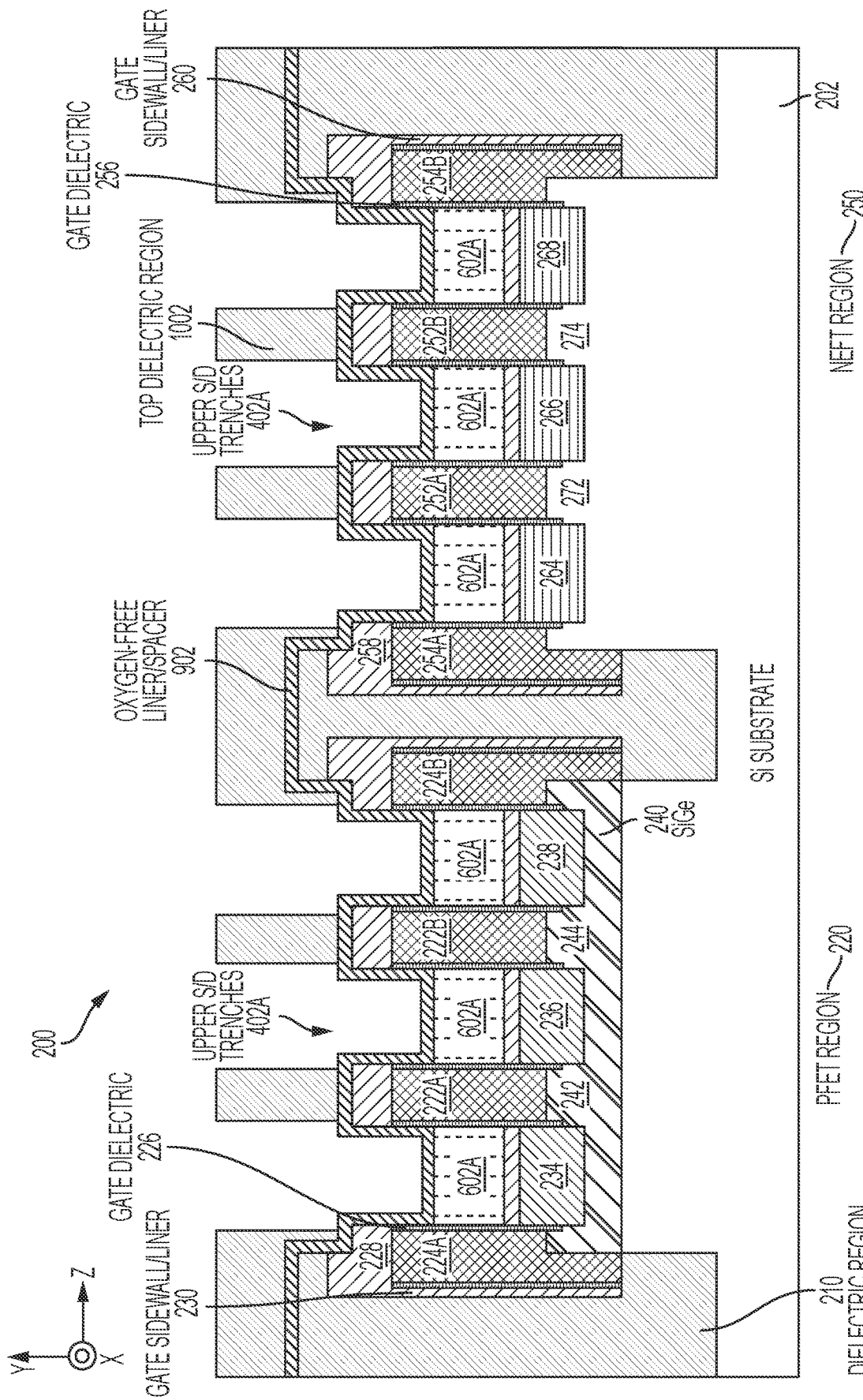

In FIG. 11, known semiconductor fabrication processes (lithography and ME) have been used to deposit a blocking mask (not shown) over selected portions of the inactive gates 224A, 224B, 254A, 254B, and known semiconductor fabrication processes (e.g., a RIE) have been used to remove non-masked portions of the top dielectric region 1002, thereby opening the upper S/D contact trenches 402A. In accordance with aspects of the invention, the portions of the replacement spacer/liner 902 that are over the metal plugs 602A function as etch-stop layers that prevents the RIE that was used to remove the non-masked portions of the top dielectric region 1002 from also removing portions of the metal plugs 602A.

Figure 12:
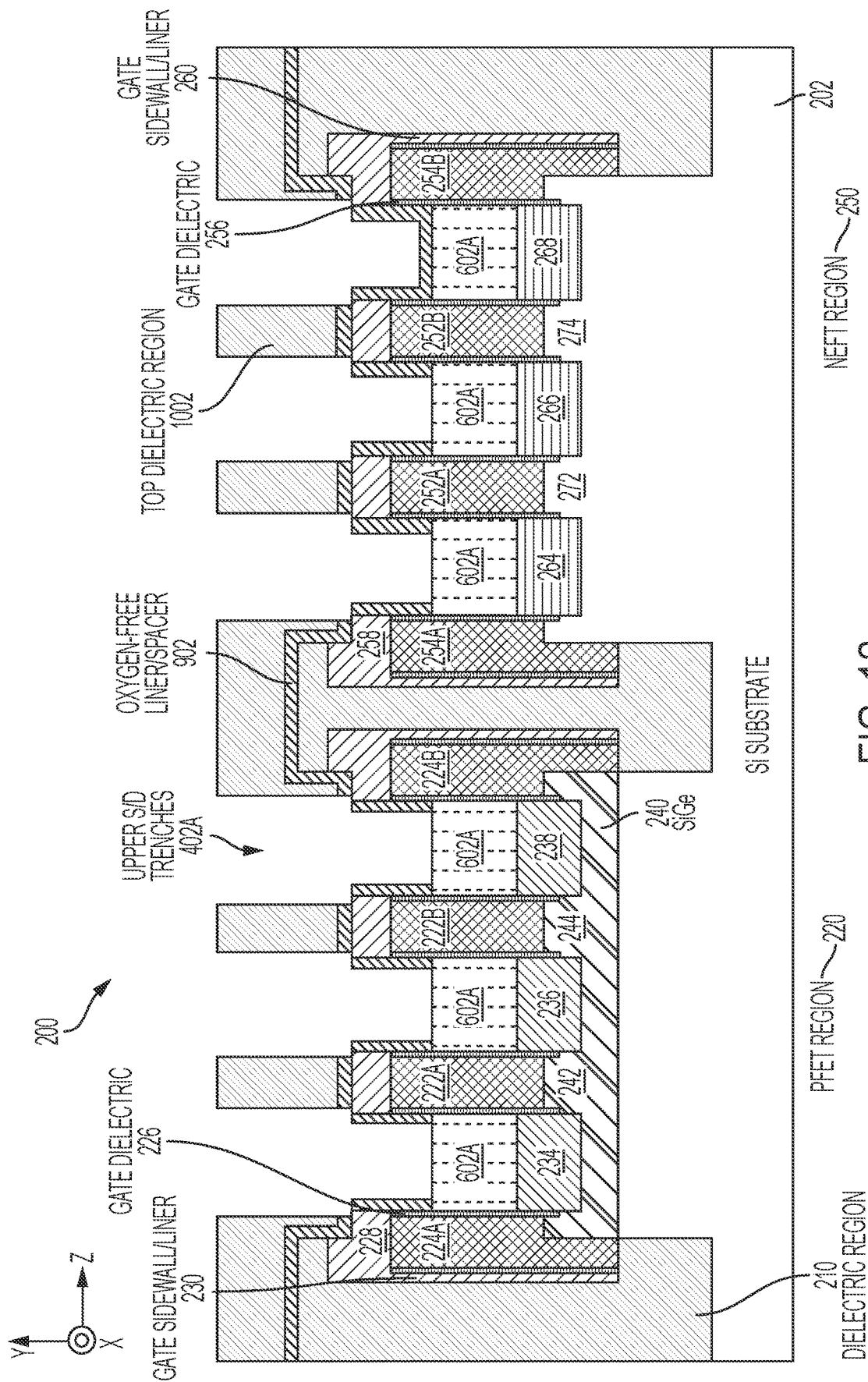

In FIG. 12, known semiconductor fabrication operations (e.g., a directional HF/HCl etch) have been used to remove the oxygen-free replacement spacers/liners 902 from over the metal plugs 602A, thereby exposing a top surface of the metal plugs 602A.

Figure 13:
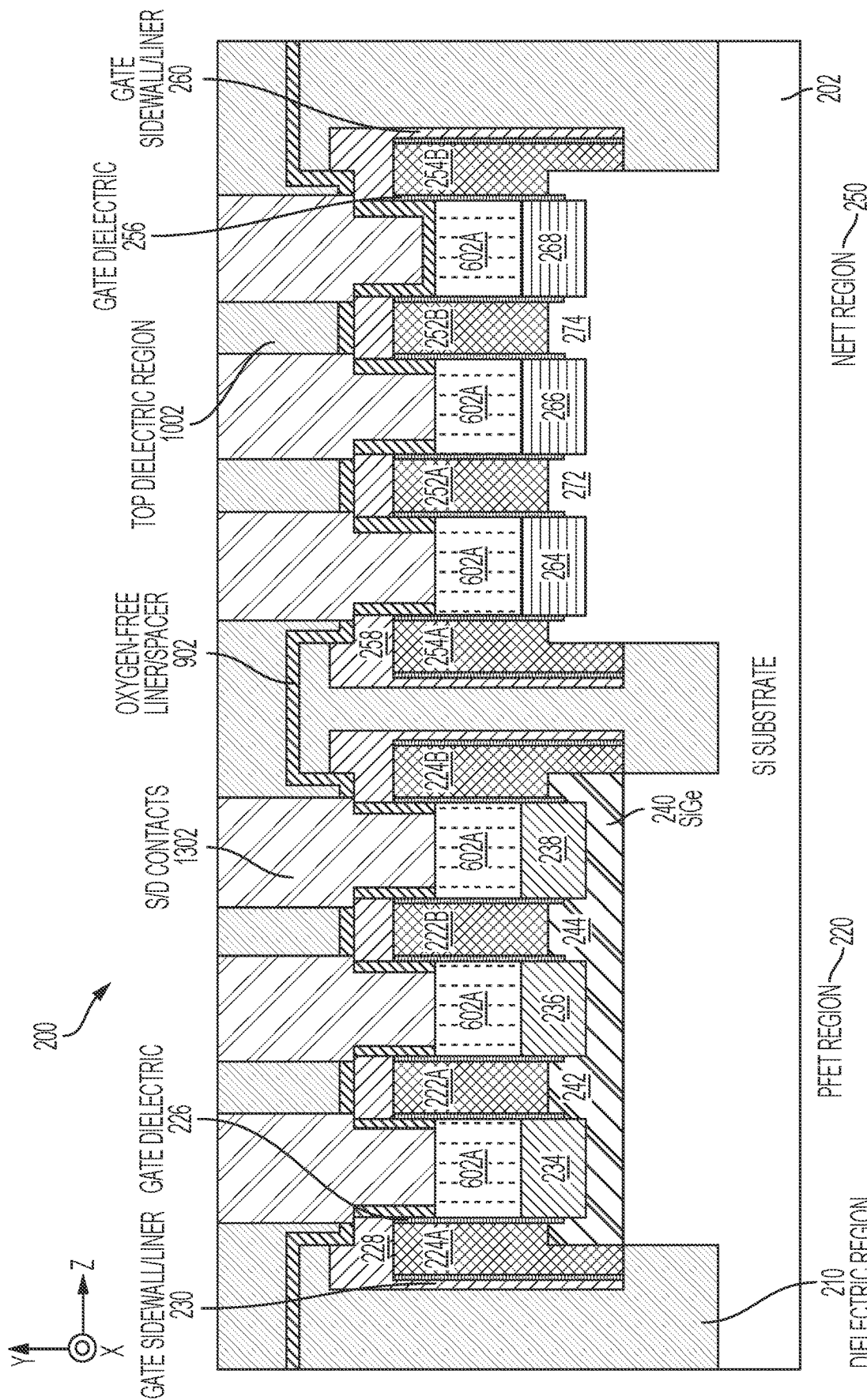

In FIG. 13, known fabrication operations have been used to deposit liners and S/D contacts (i.e., CA) 1302 in the upper S/D contact trench regions 402A (shown in FIG. 12) using any deposition technique suitable for the material that has been selected to form the liners 1302. The remaining volume of the upper S/D contact trench regions 402A is filled with the material from which the S/D contacts 1302 is formed using, for example, a chemical/electroplating process. In embodiments of the invention, the S/D contacts 1302 can be formed from a variety of low resistivity materials, including, but not limited to Cu. The excess material used to form the S/D contacts 1302 is removed and planarized to form a flat surface for subsequent processing.

In embodiments of the invention, although the contact area between each of the metal plugs 602A and each of the S/D regions 234, 236, 238, 264, 266, 268, respectively, is greater than the contact area between each of the metal plug 602A and each of the S/D contacts (CA) 1302, respectively, the primary impact on the resistance for current following vertically from the S/D regions 234, 236, 238, 264, 266, 268 through the metal plugs 602A and the S/D contacts 1302 is the contact area between the metal plugs 602A and the S/D regions 234, 236, 238, 264, 266, 268. Hence, improving the contact area between the metal plugs 602A and the S/D regions 234, 236, 238, 264, 266, 268 reduces the contact resistant for the entire metal plug and S/D contact structure 602A, 1302 despite the reduced contact area between the metal plugs 602A and the S/D contacts 1302. The oxygen-free, high physical integrity replacement spacer/liner 902 improves multiple transistor performance characteristics, including the transistors' ability to tolerate a higher maximum gate bias voltage (Vmax), as well as reducing the potential for gate-to-CA shorts.

FIGS. 14 and 15 depict embodiments of the invention in which the potential for gate-to-CA shorts can be further reduced by decreasing a width dimension of S/D contacts (CA) 1302 and filling the space between the oxygen-free replacement spacer/liner and the reduced-width S/D contacts 1302A with the top dielectric region 1002. More specifically, FIGS. 14 and 15 depict an alternative embodiment of the isolated region 1010 (shown in FIG. 10).

In FIG. 14, known semiconductor fabrication processes (lithography and ME) have been used to deposit a blocking mask (not shown) over selected portions of the inactive gates 224A, 224B, 254A, 254B, and known semiconductor fabrication processes (e.g., a RIE) have been used to remove non-masked portions of the top dielectric region 1002, thereby opening the upper S/D contact trenches 402B. In accordance with aspects of the invention, the footprints of each of the upper S/D trenches 402B is selected to match the desired footprints of the reduced-width S/D contacts 1302A. Known semiconductor fabrication operations (e.g., a directional HF/HCl etch) have also been used to remove the oxygen-free replacement spacers/liners 902 from over the metal plugs 602A, thereby exposing a portion of a top surface of the metal plugs 602A.

In FIG. 15, known fabrication operations have been used to deposit liners and reduced-width S/D contacts (i.e., CA) 1302A in the upper S/D contact trench regions 402B (shown in FIG. 14) using any deposition technique suitable for the material that has been selected to form the liners 1302A. The remaining volume of the upper S/D contact trench regions 402B is filled with the material from which the reduced-width S/D contacts 1302A is formed using, for example, a chemical/electroplating process. In embodiments of the invention, the reduced-width S/D contacts 1302A can be formed from a variety of low resistivity materials, including, but not limited to Cu. The excess material used to form the reduced-width S/D contacts 1302A is removed and planarized to form a flat surface for subsequent processing.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the detailed description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and IC fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (ME), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. An integrated circuit comprising:
  a transistor formed over a substrate;
  a dielectric region formed over the transistor and the substrate;
  a trench positioned in the dielectric region and over a source or drain (S/D) region of the transistor, wherein a sidewall of the trench comprises a gate structure of the transistor;
  a first liner and a conductive plug within the trench such that the first liner and the conductive plug are only present within a bottom portion of the trench; and
  a replacement liner and a S/D contact within a top portion of the trench such that a bottom contact surface of the S/D contact directly couples to a top surface of the conductive plug.

2. The integrated circuit of claim 1, wherein the replacement liner is substantially oxygen-free.

3. The integrated circuit of claim 1, wherein the conductive plug is electrically coupled to the S/D region of the transistor through a contact surface of the conductive plug.

4. The integrated circuit of claim 3, wherein the S/D contact is electrically coupled to the conductive plug through a contact surface of the S/D contact.

5. The integrated circuit of claim 4, wherein an area of the contact surface of the conductive plug is greater than an area of the contact surface of the S/D contact.

6. The integrated circuit of claim 1, wherein the conductive plug comprises a low resistivity silicide material.

7. The integrated circuit of claim 6, wherein the S/D contact comprises a low resistivity material.

8. The integrated circuit of claim 7, wherein the low resistivity silicide material comprises tungsten (W).

9. The integrated circuit of claim 8, wherein the S/D contact low resistivity material comprises copper (Cu).

10. The integrated circuit of claim 9, wherein the dielectric region comprises a low k dielectric material selected from the group consisting of SiBCN, SiOCN, SiCN, and SiN.

11. An integrated circuit comprising:
  a transistor formed over a substrate;
  a dielectric region formed over the transistor and the substrate;
  a trench positioned in the dielectric region and over a source or drain (S/D) region of the transistor, wherein a sidewall of the trench comprises a gate structure of the transistor;
  a first liner and a conductive plug within the trench such that the first liner and the conductive plug are only present within a bottom portion of the trench; and
  a replacement liner and a S/D contact within a top portion of the trench such that a bottom contact surface of the S/D contact directly couples to a top surface of the conductive plug;

wherein the replacement liner functions as a sidewall spacer for a portion of the gate structure.

12. The integrated circuit of claim 11, wherein the replacement liner is substantially oxygen-free.

13. The integrated circuit of claim 11, wherein the conductive plug is electrically coupled to the S/D region of the transistor through a contact surface of the conductive plug.

14. The integrated circuit of claim 13, wherein the S/D contact is electrically coupled to the conductive plug through a contact surface of the S/D contact.

15. The integrated circuit of claim 14, wherein an area of the contact surface of the conductive plug is greater than an area of the contact surface of the S/D contact.

16. The integrated circuit of claim 11, wherein the conductive plug comprises a low resistivity silicide material.

17. The integrated circuit of claim 16, wherein the S/D contact comprises a low resistivity material.

18. The integrated circuit of claim 17, wherein the low resistivity silicide material comprises tungsten (W).

19. The integrated circuit of claim 18, wherein the S/D contact low resistivity material comprises copper (Cu).

20. The integrated circuit of claim 19, wherein the dielectric region comprises a low k dielectric material selected from the group consisting of SiBCN, SiOCN, SiCN, and SiN.

* * * * *